(12) United States Patent
Kashihara

(10) Patent No.: US 6,458,284 B1
(45) Date of Patent: Oct. 1, 2002

(54) METHOD OF ETCHING AND ETCH MASK

(75) Inventor: Keiichiro Kashihara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/495,306

(22) Filed: Feb. 1, 2000

(30) Foreign Application Priority Data

Aug. 20, 1999 (JP) ............................................. 11-233579

(51) Int. Cl.$^7$ ........................... H01L 21/00; C03C 15/00
(52) U.S. Cl. .............................. 216/47; 216/41; 216/51; 438/717; 438/721
(58) Field of Search .............................. 216/41, 47, 51; 438/717, 721

(56) References Cited

U.S. PATENT DOCUMENTS

| | | | |
|---|---|---|---|
| 5,468,342 A | * 11/1995 | Nulty et al. | 438/714 |
| 5,554,488 A | * 9/1996 | Rioux | 430/315 |
| 5,903,053 A | * 5/1999 | Iijima et al. | 257/751 |
| 6,077,780 A | * 6/2000 | Dubin | 438/627 |
| 6,140,226 A | * 10/2000 | Grill et al. | 438/637 |
| 6,162,671 A | * 12/2000 | Lee et al. | 438/238 |

FOREIGN PATENT DOCUMENTS

| | | |
|---|---|---|
| JP | 60-053020 | 3/1985 |
| JP | 11-092971 | 4/1999 |

OTHER PUBLICATIONS

Wolf et al, "Dry Etching for VLSI Fabrication" silicon Processing For VLSI Era, vol. 1, 1986, p. 539.*

* cited by examiner

*Primary Examiner*—Randy Gulakowski
*Assistant Examiner*—Shamim Ahmed
(74) *Attorney, Agent, or Firm*—Oblon, Spivak, McClelland, Maier & Neustadt, P.C.

(57) ABSTRACT

A TiSiN (titanium silicon nitride) film or a multilayered film comprised of a TiSiN film and a TiSi film is used as a hard mask. The TiSiN film (1a) has good adherence to and a high etch selectivity to metal (2), and TiSi is a material having a higher etch selectivity to metal than TiSiN. The use of these materials as an etch mask solves problems with a conventional hard mask such as an SiO$_2$ film. The use of the TiSiN film also as a barrier metal layer (3) allows the process to proceed rapidly in the steps of forming and removing the hard mask and the barrier metal layer. An etching method uses the hard mask made of the material which has good adherence to and a high etch selectivity to an electrode material and which requires the uncomplicated steps of forming and removing the same.

24 Claims, 15 Drawing Sheets

F/G. 23 (BACKGROUND ART)
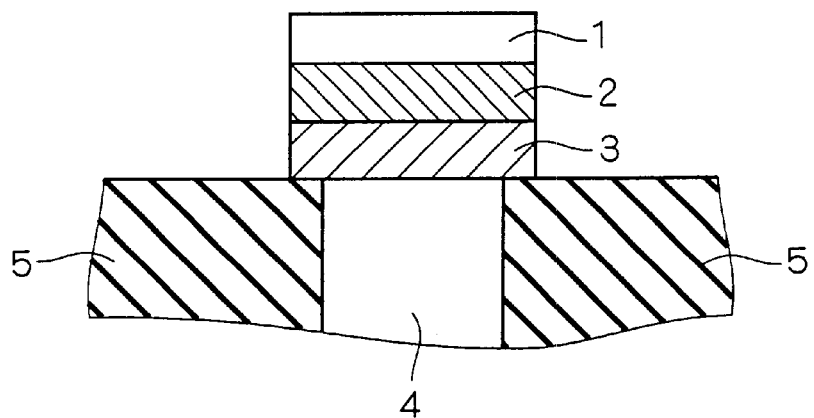
F/G. 24 (BACKGROUND ART)
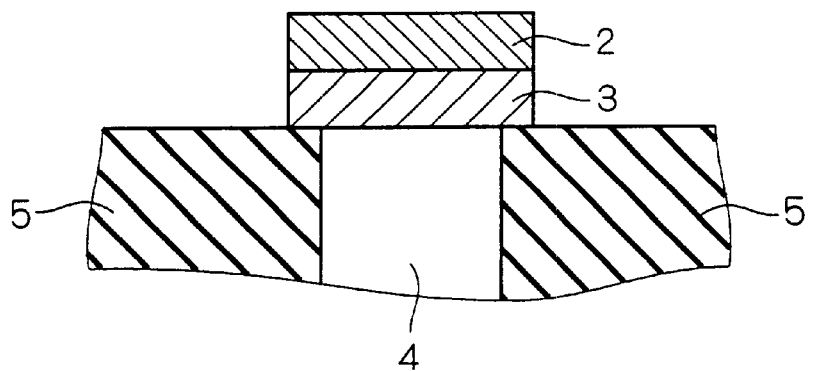

METHOD OF ETCHING AND ETCH MASK

BACKGROUND OF THE INVENTION

1. Field of the Invention

The present invention relates to an etching method for use in the manufacture of a semiconductor device and the like and an etch mask for use in the etching method.

2. Description of the Background Art

FIG. 12 is a cross-sectional view of a DRAM including a capacitor having a dielectric film made of a material having a high dielectric constant such as BST (barium strontium titanate). The DRAM comprises MISFETs 18 formed on a semiconductor substrate 13, and capacitors 19. Isolation regions 14 and active regions 15 are formed in the semiconductor substrate 13. MIS gates 16, contact plugs 4, a bit line 17 and a interlayer insulation film 5 are formed on the surface of the semiconductor substrate 13. Each of the MISFETs 18 comprises one MIS gate 16 and two active regions 15 on opposite sides of part of the semiconductor substrate 13 which lies immediately under the MIS gate 16.

Each of the capacitors 19 comprises an upper electrode 10, a dielectric layer 9 made of the high dielectric constant material, and a lower electrode 2 connected to its associated active region 15 through a barrier metal layer 3 and a contact plug 4. The barrier metal layer 3 is formed between the contact plug 4 and the lower electrode 2 for the purpose of preventing adverse effects of contact of the contact plug 4 with the lower electrode 2 upon the lower electrode 2 (e.g., such an effect that when the contact plug 4 is made of polysilicon and the lower electrode 2 is made of metal, the metal in contact with the polysilicon is silicided to increase the resistance value thereof). The barrier metal layer 3 is made of, for example, TiN or TaN. A lower electrode sidewall 8 is formed to prevent the barrier metal layer 3 from contacting the dielectric layer 9.

In FIG. 12, two capacitors 19 are shown as formed in corresponding relationship with two MISFETs 18, and two lower electrodes 2, two barrier metal layers 3 and two lower electrode sidewalls 8 are shown as formed in side-by-side relation on opposite sides of the bit line 17. The dielectric layer 9 and the upper electrode 10 are common to the two capacitors 19.

An interlayer insulation film 11 is formed on an upper surface of the upper electrode 10, and an interconnect layer 12 is formed on an upper surface of the interlayer insulation film 11, as illustrated in FIG. 12.

The electrodes of the capacitor including the dielectric layer made of the high dielectric constant material are made of, e.g., metal such as Pt (platinum). The electrodes made of such metal may be formed by, e.g., dry etching. However, since the metal such as Pt is inactive to chemical reactions at near room temperature, etching resulting from a chemical reaction does not vigorously occur under etching conditions at near room temperature, but an etching process proceeds almost by the action of physical etching (which etching process is referred to hereinafter as sputter etching).

The procedure of the process of performing sputter etching on the metal such as Pt will be described with reference to FIGS. 13 through 19, taking the process of forming the capacitor 19 shown in FIG. 12 as an example. First, the semiconductor substrate 13 with the interlayer insulation film 5 and the contact plug 4 formed thereon is prepared.

The barrier metal layer material 3 and the lower electrode material 2 (metal such as Pt) stacked in the order named are formed on the surfaces of the interlayer insulation film 5 and the contact plug 4. A photoresist 6 is formed on the surface of the lower electrode material 2 and patterned using a photolithographic technique (FIG. 13). Part of the lower electrode material 2 which is not covered with the photoresist 6 is removed by the sputter etching (FIG. 14).

During the sputter etching, sputtering causes the redeposition of the lower electrode material 2, and the redeposits are prone to adhere to the photoresist 6. A redeposit adhering to the upper surface of the photoresist 6 is soon removed by the sputter etching, but a deposit 7 contiguous with the lower electrode 2 is formed on the side surface of the photoresist 6 as shown in FIG. 14.

Thereafter, part of the barrier metal layer material 3 which is not covered with the photoresist 6 and the lower electrode 2 is removed (FIG. 15). The remaining photoresist 6 is then removed (FIG. 16). The deposit 7 which would hinder the lower electrode 2 from functioning as a capacitor electrode is removed by scrubber treatment (FIG. 17).

The material of the lower electrode sidewall 8 is formed to cover the lower electrode 2, the barrier metal layer 3 and the interlayer insulation film 5 (FIG. 18), and is etched back by the sputter etching (FIG. 19). Thereafter, the dielectric layer 9 and the upper electrode 10 are formed. This completes the capacitor 19.

However, there has been a likelihood that the reliability of the capacitor decreases to reduce yields in spite of the removal of the deposit 7 for reasons to be described below. In some cases, the deposit 7 is not completely removed by the scrubber treatment, and a residue of the deposit 7 establishes a short circuit, for example, between the upper electrode 10 and the lower electrode 2. In other cases, traces 7a of the deposit 7 remain after the scrubber treatment of the deposit 7 as shown in FIGS. 17 through 19 to cause electric field concentration during the operation of the capacitor because of their protruding shape, which might induce a leakage current.

To suppress the development of such a deposit 7, the photoresist 6 should be made as thin as possible for reduction in side surface area thereof. The reduction in side surface area decreases the amount of the redeposit adhering to the photoresist 6. Further, since the redeposit is less prone to adhere to a top part of the side surface of the photoresist 6 under the influence of the sputter etching performed from above, it can be contemplated that the reduction in the thickness of the photoresist 6 results in the deposit less prone to develop on the side surface of the photoresist 6.

However, there is a likelihood that the photoresist 6 of the reduced thickness does not function as an etch mask when the lower electrode material 2 is sputter etched. The photoresist is not high in physical strength and is gradually removed as the sputter etching proceeds as shown in FIGS. 14 and 15. Thus, the photoresist 6 of the reduced thickness might be completely removed. It is hence difficult to reduce the thickness of the photoresist 6.

To solve the above problem, it is contemplated to use a physically strong material, rather than the photoresist, as the etch mask (which etch mask is referred to hereinafter as a hard mask). The procedure of the etching process using the hard mask will be described with reference to FIGS. 20 through 24, taking the process of forming the capacitor 19 of FIG. 12 as an example.

First, the semiconductor substrate 13 with the interlayer insulation film 5 and the contact plug 4 formed thereon is prepared. The barrier metal layer material 3, the lower electrode material 2 and a hard mask material 1 stacked in the order named are formed on the surfaces of the interlayer insulation film 5 and the contact plug 4. The photoresist 6 is formed on the surface of the hard mask material 1 and patterned using a photolithographic technique (FIG. 20). Part of the hard mask material 1 which is not covered with the photoresist 6 is removed by dry etching or the like. The photoresist 6 is also removed (FIG. 21).

Part of the lower electrode material 2 which is not covered with the hard mask material 1 is removed by the sputter etching (FIG. 22). Thereafter, part of the barrier metal layer material 3 which is not covered with the hard mask material 1 is removed (FIG. 23). The hard mask 1 is then removed (FIG. 24).

The lower electrode sidewall 8 is formed in a manner described with reference to FIGS. 18 and 19. Thereafter, the dielectric layer 9 and the upper electrode 10 are formed. This completes the capacitor.

When the hard mask is thus used which may be reduced in thickness, the redeposit of the lower electrode 2 is not prone to adhere to the side surface of the hard mask 1 during the sputter etching. This eliminates the need for the scrubber treatment to produce neither the short circuit resulting from the residue of the deposit nor the protruding traces of the deposit in the capacitor. Therefore, there is little likelihood that the reliability of the capacitor decreases to reduce yields. Examples of such a hard mask in current use are a $SiO_2$ (silicon dioxide) film 1c as shown in FIG. 25 and a TiN (titanium nitride) film Id as shown in FIG. 26.

The use of etching (referred to hereinafter as reactive etching) involving not only the sputter etching but also etching resulting from a chemical reaction for the formation of the lower electrode 2 also suppresses the development of the above-mentioned mentioned deposit. The reactive etching which involves the etching resulting from a chemical reaction reduces the amount of redeposit of the lower electrode material 2 resulting from the sputtering. Accordingly, the redeposit is less prone to adhere to the side surface of the etch mask.

For this purpose, the etching is performed under the conditions of temperature at which the metal such as Pt is active to chemical reactions. That is, temperature must be raised during the etching. However, in the case of etching which uses the photoresist as the etch mask, the photoresist fails to function as the etch mask, e.g., at about 200° C. in some cases. It is hence difficult to establish the high temperature etching conditions.

On the other hand, a heat resistant material may be selected for the hard mask. The above described $SiO_2$ film and the TiN film are resistant to heat under the conditions of temperature at which the metal such as Pt is active to chemical reactions. Therefore, reactive etching may be performed using a process similar to that of the sputter etching shown in FIGS. 20 through 24. Thus, the reactive etching which involves the etching resulting from a chemical reaction for the formation of the lower electrode 2 makes the deposit even less prone to develop than does the sputter etching alone.

However, the $SiO_2$ film and the TiN film used as the hard mask are not always suitable for the hard mask. The materials of these films present problems particularly when the electrode is made of metal such as Pt. More specifically, the $SiO_2$ film has poor adherence to metal such as Pt and thus is prone to cause pattern removal. The TiN film has an insufficient etch selectivity to metal such as Pt. Increasing the thickness of the hard mask so as to compensate for the insufficiency of the etch selectivity results in the development of more deposit and the difficulty in patterning the hard mask itself To solve both of the problems with the $SiO_2$ film and the TiN film, it has been contemplated to use as the hard mask a multilayered $SiO_2$/TiN film as shown in FIG. 27 which comprises the TiN film 1d and the $SiO_2$ film 1c formed thereon.

Unfortunately, the use of the multilayered $SiO_2$/TiN film requires the additional steps of forming and removing the same, resulting in a complicated process. Particularly in the step of forming the multilayered $SiO_2$/TiN film, the TiN film is formed by a PVD (Physical Vapor Deposition) process whereas the $SiO_2$ film is formed by a CVD (Chemical Vapor Deposition) process. This necessitates the removal of the semiconductor device out of PVD equipment and the transfer of the semiconductor device into CVD equipment.

SUMMARY OF THE INVENTION

According to a first aspect of the present invention, a method of etching comprises the steps of: (a) preparing a substrate; (b) forming a film to be etched on the substrate; (c) forming a first TiSiN film on a surface of the film to be etched; (d) patterning the first TiSiN film by a photolithographic technique; and (e) etching the film to be etched, using the patterned first TiSiN film as an etch mask.

Preferably, according to a second aspect of the present invention, the method of the first aspect further comprises the step of (f) isotropically etching the first TiSiN film, the step (f) being performed after the step (d) and before the step (e).

Preferably, according to a third aspect of the present invention, the method of the first aspect further comprises the step of (f) forming a TiSi film on a surface of the first TiSiN film, the step (f) being performed before the step (d), wherein the first TiSiN film and the TiSi film are patterned into the same configuration by a photolithographic technique in the step (d).

Preferably, according to a fourth aspect of the present invention, the method of the third aspect further comprises the step of (g) isotropically etching the first TiSiN film and the TiSi film, the step (g) being performed after the step (d) and before the step (e).

Preferably, according to a fifth aspect of the present invention, the method of any one of the first to fourth aspects further comprises the step of (h) forming a second TiSiN film on the substrate, the step (h) being performed before the step (b).

According to a sixth aspect of the present invention, an etch mask comprises: Ti; Si; and N.

According to a seventh aspect of the present invention, an etch mask comprises: a first layer made of TiSiN; and a second layer made of TiSi and formed on an upper surface of the first layer.

The etching method according to the first aspect of the present invention provides the first TiSiN film functioning as an etch mask having good adherence to and a high etch selectivity to the film to be etched when the film to be etched is made of metal. Further, the first TiSiN film differs from a conventional multilayered $SiO_2$/TiN film in that it does not require the complicated steps of forming and removing the same.

The etching method according to the second aspect of the present invention can narrow the first TiSiN film serving as the etch mask to pattern the film to be etched into a smaller configuration.

The etching method according to the third aspect of the present invention provides the TiSi film functioning as an etch mask having a higher etch selectivity to the film to be etched when the film to be etched is made of metal, as well as producing the effects of the etching method of the first aspect.

The etching method according to the fourth aspect of the present invention can narrow the first TiSiN film and the TiSi film serving as the etch mask to pattern the film to be etched into a smaller configuration.

The etching method according to the fifth aspect of the present invention provides the second TiSiN film functioning as a barrier metal for the film to be etched. Additionally, the etching method according to the fifth aspect permits the process to proceed rapidly in the steps of forming and removing the first and second TiSiN films.

The etch mask according to the sixth aspect of the present invention has good adherence to and a high etch selectivity to a film to be etched when the film to be etched is made of metal.

The etch mask according to the seventh aspect of the present invention includes the first layer having good adherence to the film to be etched and the second layer having a higher etch selectivity to the film to be etched than the first layer when the film to be etched is made of metal.

It is therefore an object of the present invention to provide an etching method using a hard mask made of a material which has good adherence to and a high etch selectivity to an electrode material and which requires the uncomplicated steps of forming and removing the same.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 20 through 24 are cross-sectional views showing respective steps in an etching method using a hard mask as the etch mask;

DESCRIPTION OF THE PREFERRED EMBODIMENTS

First Preferred Embodiment

A first preferred embodiment of the present invention relates to an etching method using a TiSiN (titanium silicon nitride) film as a hard mask. The TiSiN film has good adherence to and a high etch selectivity to metal such as Pt. The use of the TiSiN film as an etch mask overcomes the problems with the $SiO_2$ film, TiN film and multilayered $SiO_2$/TiN film which have been conventionally used as the hard mask.

Figure 12:
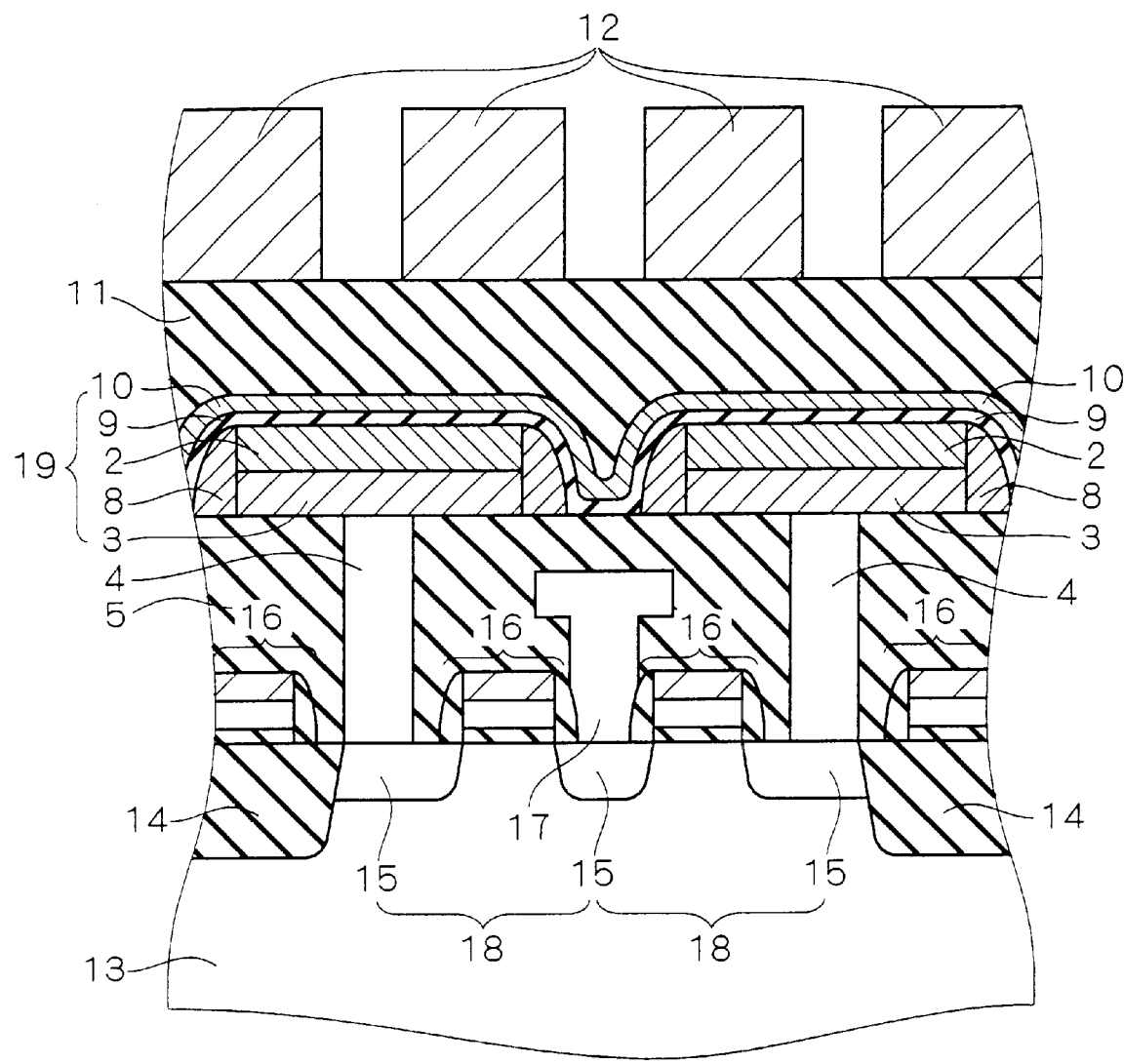
FIG. 12 is a cross-sectional view of a DRAM.
Figure 13:
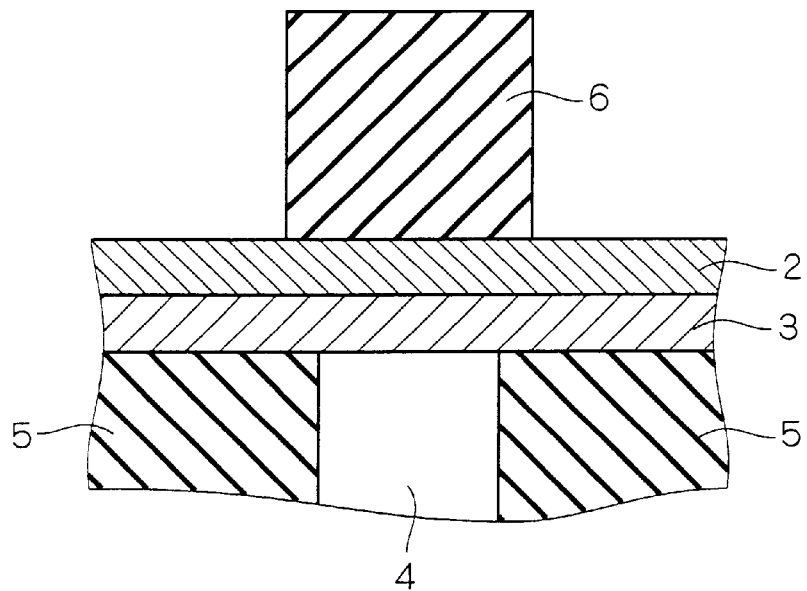
FIGS. 13 through 19 are cross-sectional views showing respective steps in a background art etching method using a photoresist as an etch mask.
Figure 14:
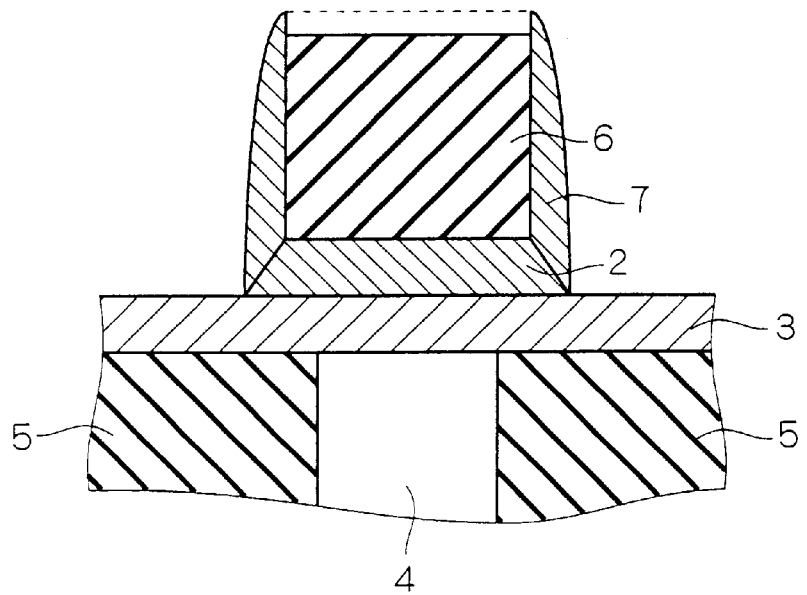
Figure 15:
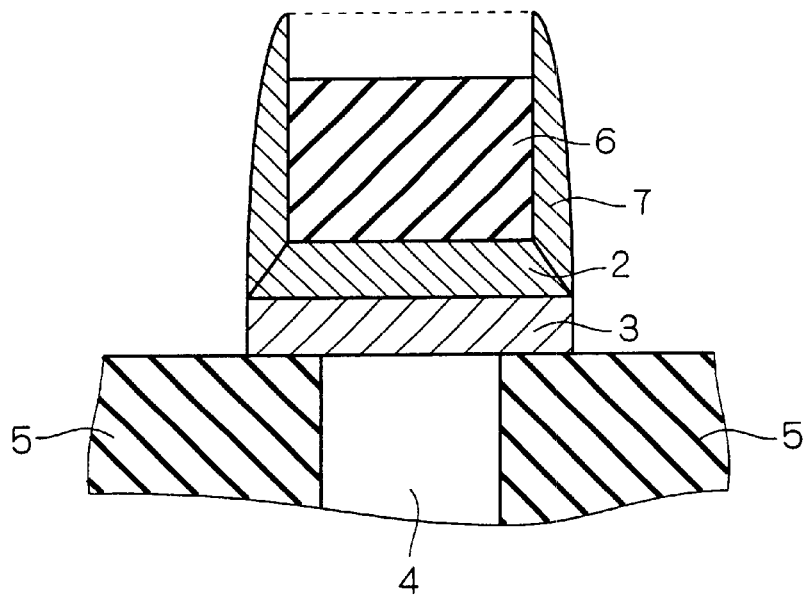
Figure 16:
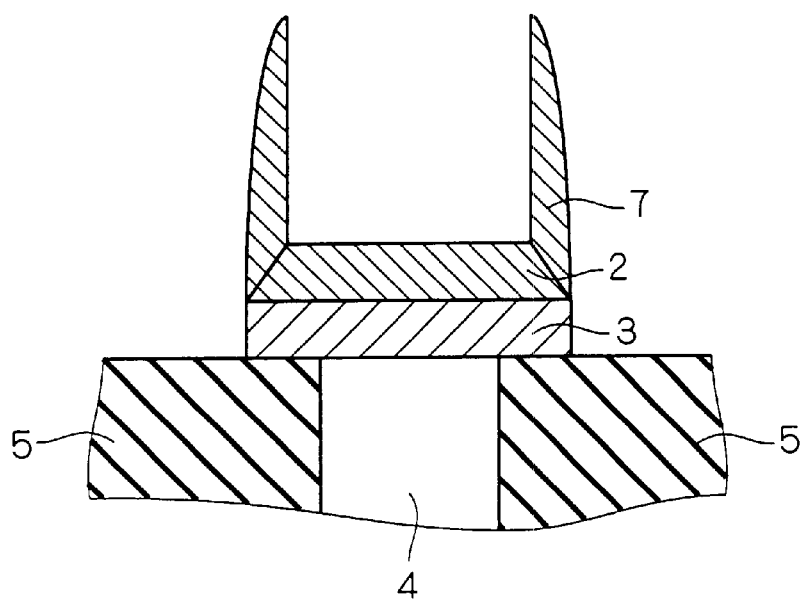
Figure 17:
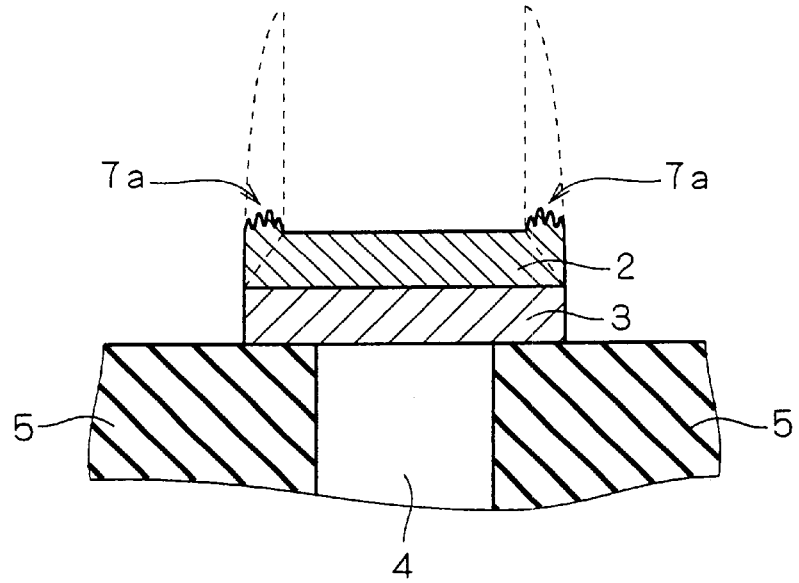
Figure 18:
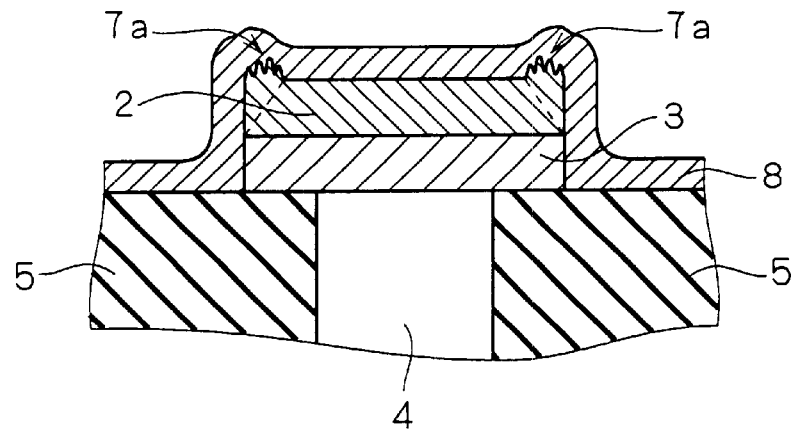
Figure 19:
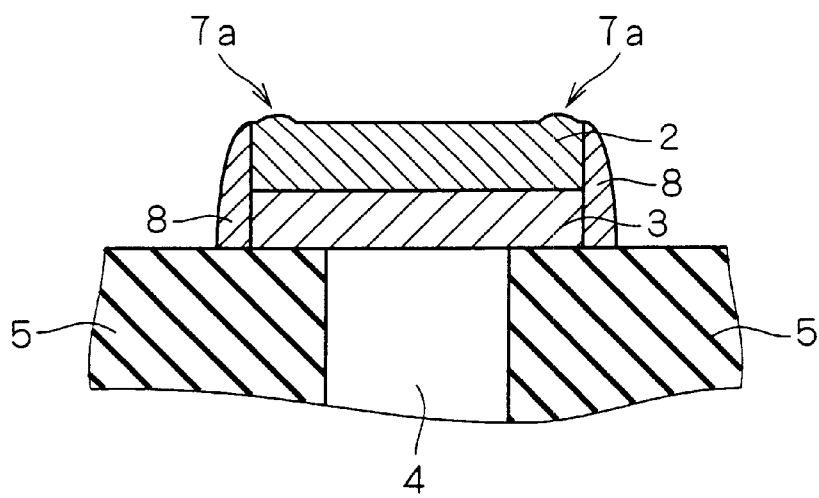
Figure 20:
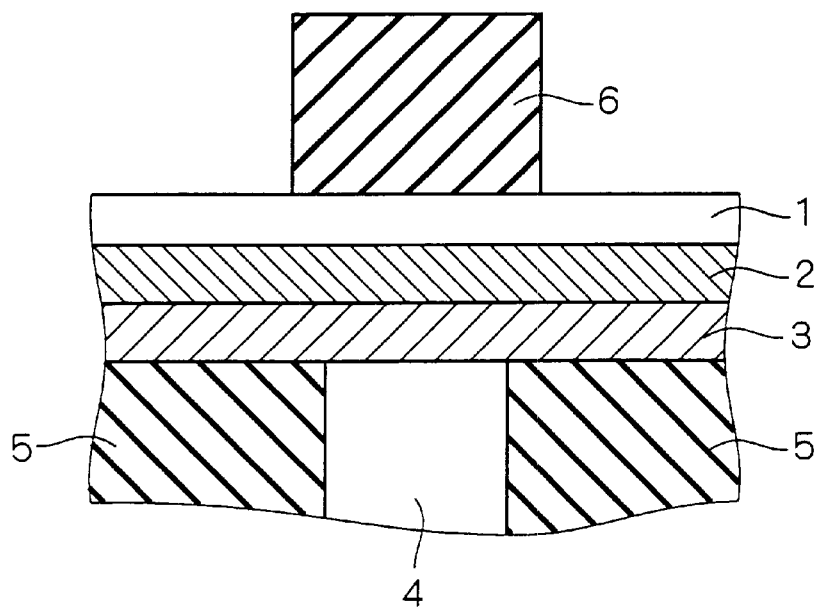
Figure 21:
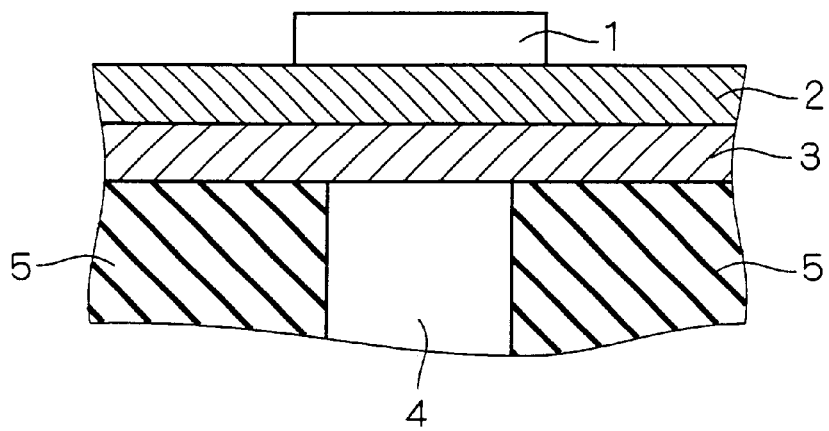

With reference to FIGS. 1 through 5, an etching process in which a lower electrode material 2 is adopted as a film to be etched will be described according to the first preferred embodiment of the present invention, taking the process of forming the capacitor 19 shown in FIG. 12 as an example.

Figure 1:
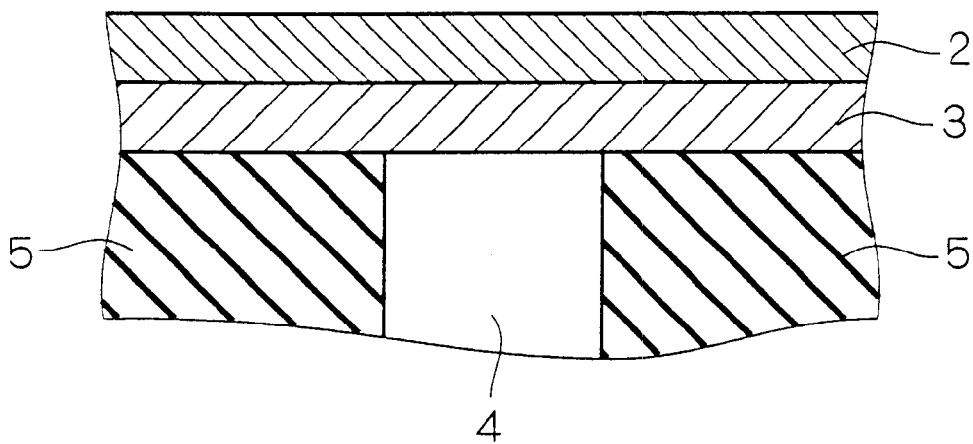
FIGS. 1 through 5 are cross-sectional views showing respective steps in an etching method according to a first preferred embodiment of the present invention.

First, a semiconductor substrate 13 with an interlayer insulation film 5 and a contact plug 4 formed thereon is prepared. A barrier metal layer material 3 made of, e.g., TiN and the lower electrode material 2 made of, e.g., Pt which are stacked in the order named are formed on the surfaces of the interlayer insulation film 5 and the contact plug 4 (FIG. 1). For instance, the barrier metal layer material 3 may be on the order of 150 to 200 nm in thickness, and the lower electrode material 2 may be on the order of 200 to 300 nm in thickness.

Figure 2:
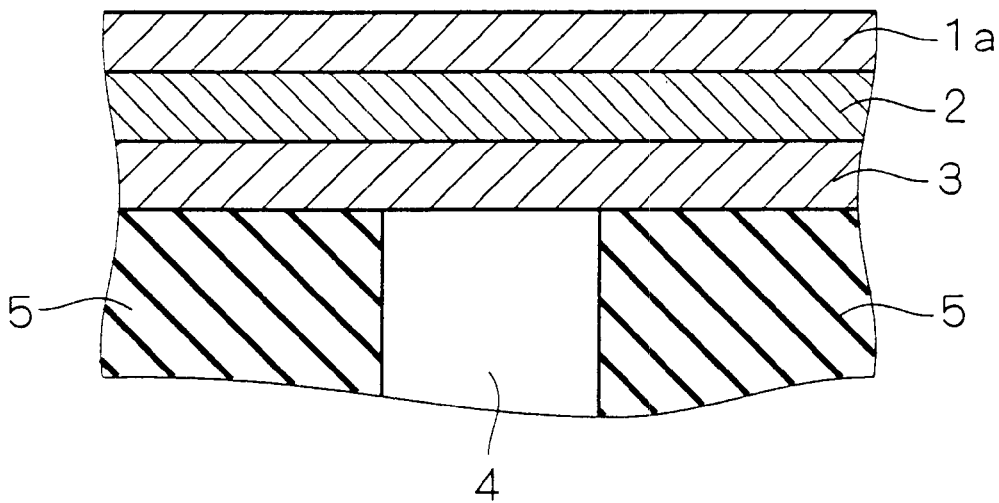

A TiSiN film 1a serving as a hard mask material is formed on the lower electrode material 2 (FIG. 2). The TiSiN film 1a may be formed by sputtering a TiSi sputtering target, e.g., in a $N_2$ gas atmosphere by means of PVD equipment. The TiSiN film 1a may be, for example, on the order of 150 to 200 nm in thickness.

Figure 3:
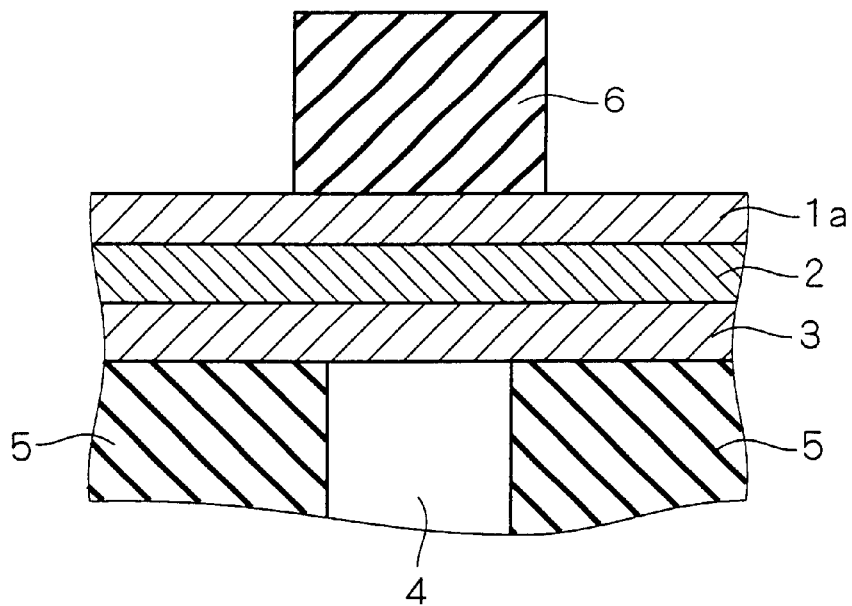
Figure 4:
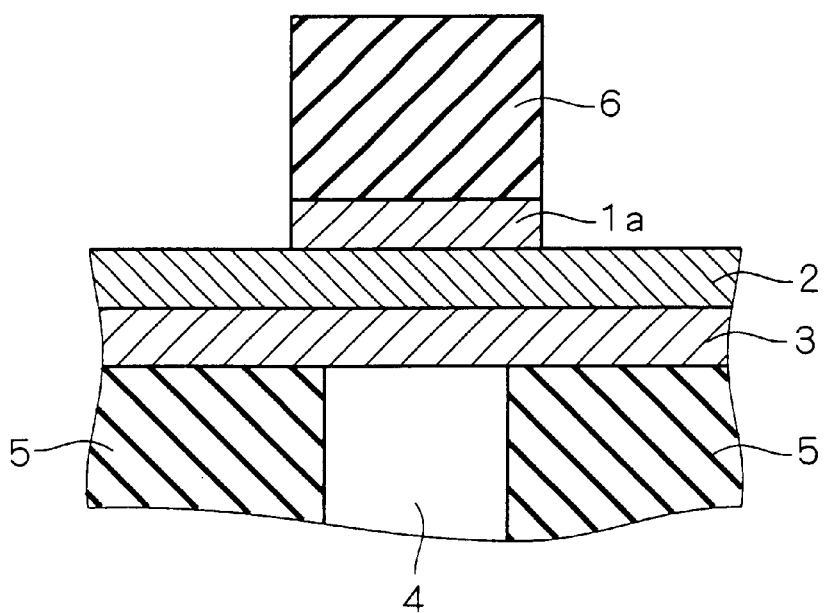

A photoresist 6 is formed on the surface of the TiSiN film 1a and patterned using a photolithographic technique (FIG. 3). Next, part of the TiSiN film 1a which is not covered with the photoresist 6 is removed by reactive ion etching using a $Cl_2$/Ar gas mixture as an etchant, e.g., at near room temperature (FIG. 4). The reactive ion etching is performed at near room temperature, rather than the temperature at which metal is active to chemical reactions, to allow only the TiSiN film 1a to be etched without the removal of the lower electrode material 2. The TiSiN film 1a may be etched by reactive ion etching using a fluorine-based gas such as $CF_4/O_2$, as well as the $Cl_2$-based gas such as the $Cl_2$/Ar gas mixture, as an etchant.

Figure 5:
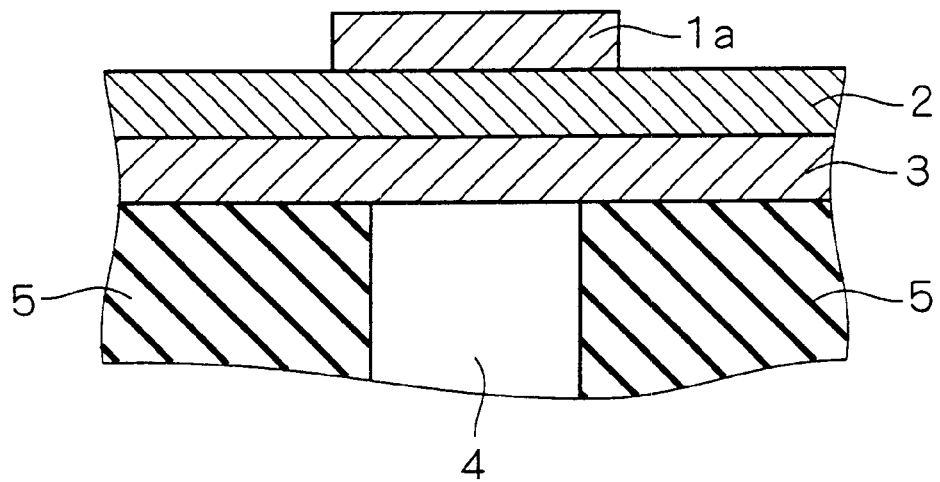

The photoresist 6 is also removed (FIG. 5). This completes the patterning of the hard mask.

Figure 22:
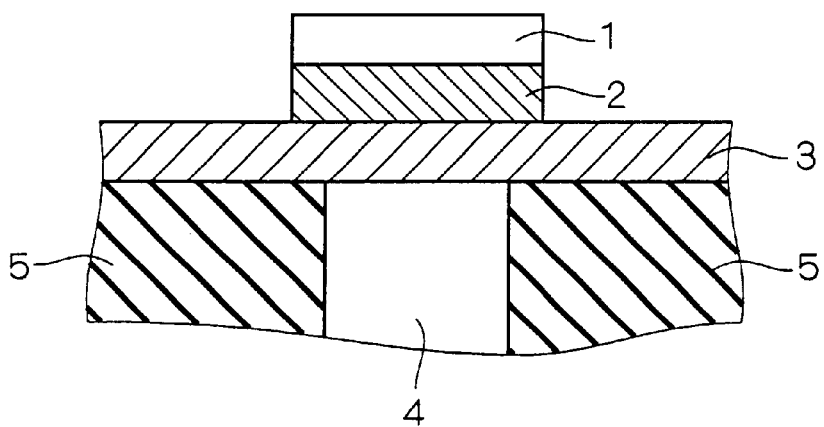
Figure 25:
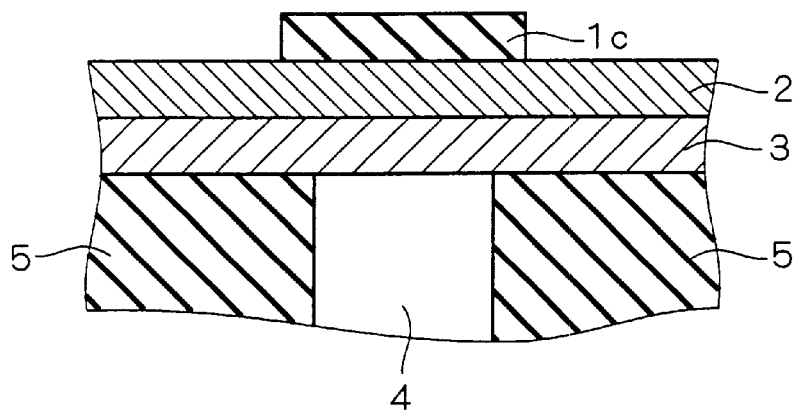
FIG. 25 is a cross-sectional view of a background art hard mask which is a $SiO_2$ film.
Figure 26:
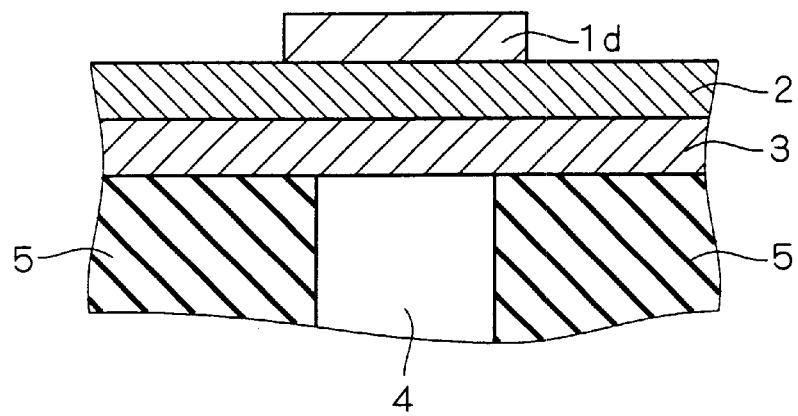
FIG. 26 is a cross-sectional view of a background art hard mask which is a TiN film.
Figure 27:
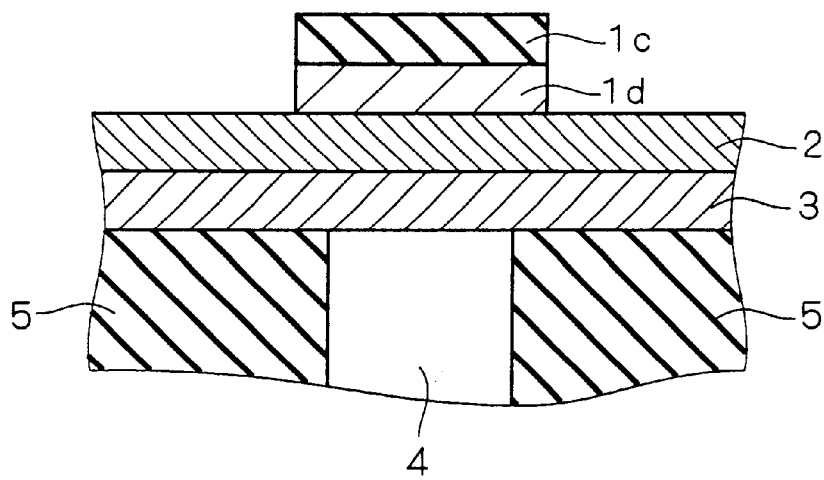
FIG. 27 is a cross-sectional view of a background art hard mask which is a multilayered $SiO_2$/TiN film.

Thereafter, the lower electrode material 2 is etched in a manner described with reference to FIG. 22. When the sputter etching is performed on the lower electrode material 2, an $Ar/O_2$ gas mixture, for example, may be used as an etchant. The lower electrode material 2, when it is, e.g., Pt, may be sputter etched using, e.g., helicon wave plasma etching equipment under the following conditions: an $Ar:O_2$ flow rate (in sccm) ratio of 4:1 of the $Ar/O_2$ gas mixture, a pressure of 1.6 mTorr, a stage temperature of 40° C, a source power of 1600 W and a bias power of 300 W, thereby providing an etch selectivity (etchable film thickness ratio per unit time) between the TiSiN film 1a and the lower electrode material 2 which is 1:49.

When the reactive etching is performed on the lower electrode material 2, a $Cl_2/O_2$ gas mixture, for example, may be used as an etchant at a stage temperature of 270° C. or higher. This reactive etching allows only the lower electrode material 2 to be etched without etching the TiSiN film 1a since $Cl_2$ gas is mixed with $O_2$ gas.

Next, part of the barrier metal layer 3 which is not covered with the TiSiN film 1a is removed in a conventional manner described with reference to FIG. 23. Thereafter, the TiSiN film 1a is removed by reactive ion etching using a $Cl_2$/Ar gas mixture as an etchant, e.g., at near room temperature, as is performed during the patterning.

The barrier metal layer material 3 may be a nitride or silicon nitride of a transition metal such as TiN, WN, TaN, WSIN and TaSiN, but also may be TiSiN that is the same material as the hard mask. The use of TiSiN as the material of the barrier metal layer 3 as well as the hard mask has a process advantage in the steps of forming and removing the hard mask and the barrier metal layer.

In the forming step, the lower electrode material 2 and the TiSiN film are prepared in different chambers (first and second chambers, respectively) in the same PVD equipment. This is followed by the sub-steps of forming the barrier metal layer 3 using the second chamber, selecting the first chamber to form the lower electrode material 2, and selecting again the second chamber to form the TiSiN film 1a serving as the hard mask. The need to transfer the semiconductor device between different types of equipment to form the respective layers as in the case of the background art multilayered $SiO_2$/TiN film is eliminated.

In the removing step, the TiSiN film 1a serving as the hard mask is also removed when the barrier metal layer 3 is etched. Thus, suitable etch conditions may be established after adjusting the thicknesses of the respective layers, such as making the thickness of the hard mask and the thickness of the barrier metal layer equal to each other, to allow the process to proceed to the stage shown in FIG. 24 immediately after the stage shown in FIG. 22, without passing the stage shown in FIG. 23.

According to the etching method of the first preferred embodiment, when the film to be etched is made of metal such as Pt, the TiSiN film functions as an etch mask having good adherence to and a high etch selectivity to the film to be etched. Additionally, the TiSiN film is formed and removed in uncomplicated steps, unlike the background art multilayered $SiO_2$/TiN film.

Further, when the barrier metal layer 3 is the TiSiN film, the process proceeds rapidly in the steps of forming and removing the hard mask and the barrier metal layer.

Although the film to be etched is made of metal such as Pt as an example in the first preferred embodiment, the TiSiN film functions as the hard mask when other materials are used as the film to be etched. The TiSiN film functions as the etch mask not only for dry etching such as the sputter etching and reactive etching but also for wet etching of metal. Therefore, the first preferred embodiment of the present invention may be applied to general etching methods.

Second Preferred Embodiment

A second preferred embodiment of the present invention is a modification of the first preferred embodiment and features an etching method which uses a multilayered film comprised of a TiSiN film and a TiSi film as the hard mask. When $O_2$-based gas is used for etching, the formation of the TiSi film having a higher etch selectivity to metal such as Pt than the TiSiN film on the upper surface of the TiSiN film provides an etch mask having a higher etch selectivity.

With reference to FIGS. 6 through 9, an etching process in which the lower electrode material 2 is adopted as the film to be etched will be described according to the second preferred embodiment of the present invention, taking the process of forming the capacitor 19 shown in FIG. 12 as an example.

As described in the first preferred embodiment, the semiconductor substrate 13 with the interlayer insulation film 5 and the contact plug 4 formed thereon is prepared. The barrier metal layer material 3 and the lower electrode material 2 which are stacked in the order named are formed on the surfaces of the interlayer insulation film 5 and the contact plug 4.

Figure 6:
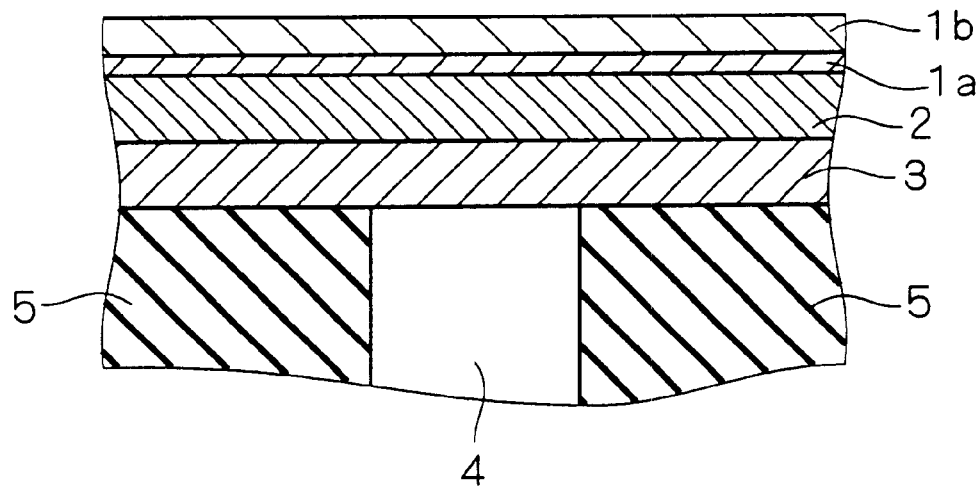
FIGS. 6 through 9 are cross-sectional views showing respective steps in the etching method according to a second preferred embodiment of the present invention.

The TiSiN film 1a and the TiSi film 1b serving as the hard mask material are formed in the order named on the lower electrode material 2 (FIG. 6). The TiSiN film 1a may be formed by sputtering a TiSi sputtering target, e.g., in a $N_2$ gas atmosphere by means of PVD equipment. The TiSiN film 1a may be, for example, about 50 nm in thickness. The TiSi film 1b may be formed by only changing the gas from the $N_2$ gas to Ar gas in a continuous manner without process interruption after the formation of the TiSiN film 1a, using the same PVD equipment and the same sputtering target. The TiSi film 1b may be, for example, on the order of 100 to 150 nm in thickness.

Figure 7:
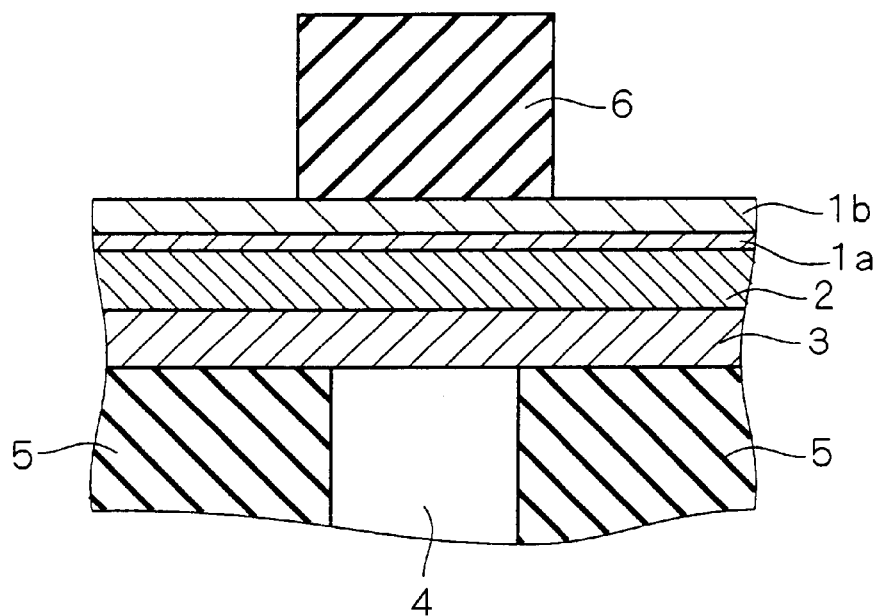
Figure 8:
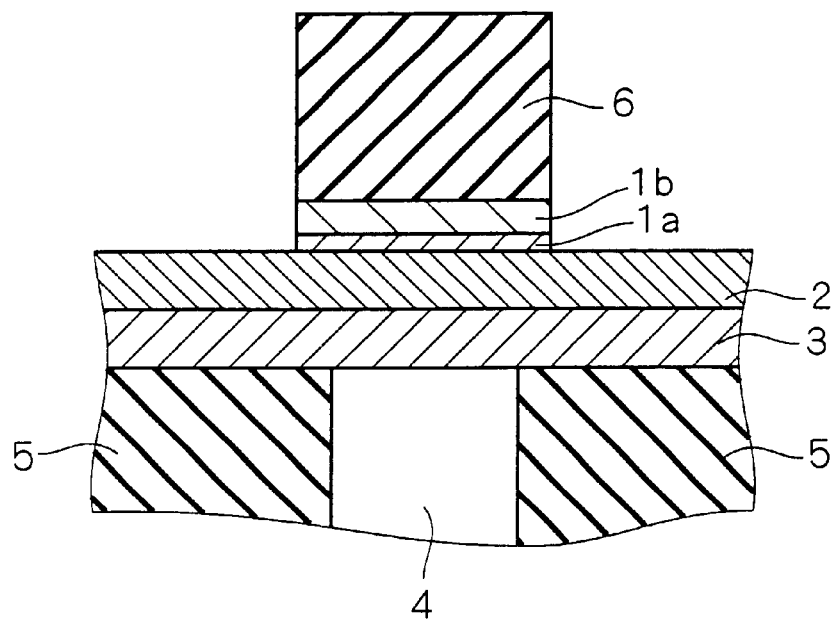

As in the first preferred embodiment, the photoresist 6 is formed on the surface of the multilayered film comprised of the TiSiN film 1a and the TiSi film 1b, and patterned using a photolithographic technique (FIG. 7). Next, as in the first preferred embodiment, parts of the TiSiN film 1a and the TiSi film 1b which are not covered with the photoresist 6 are removed by reactive ion etching using a $Cl_2$/Ar gas mixture as an etchant, e.g., at near room temperature, whereby the TiSiN film 1a and the TiSi film 1b are patterned into the same configuration (FIG. 8).

Figure 9:
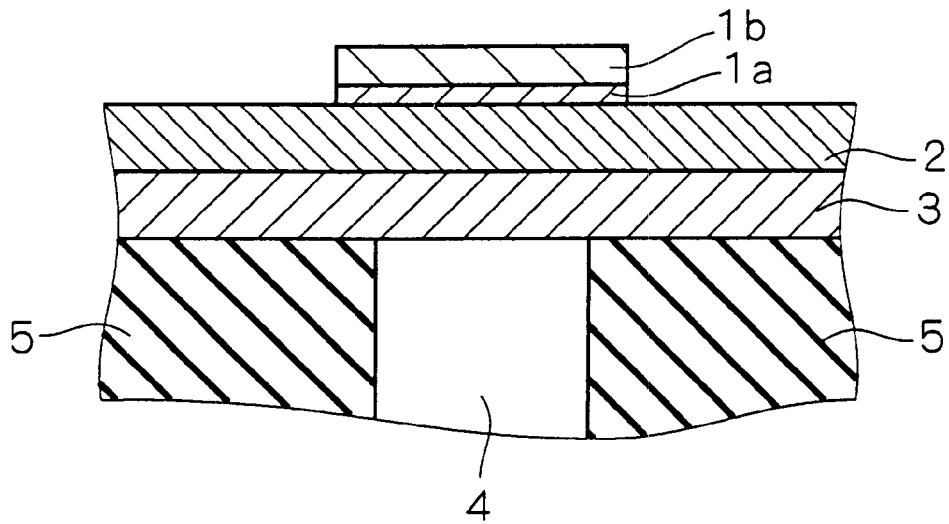

The photoresist 6 is also removed (FIG. 9). This completes the patterning of the hard mask.

Thereafter, the lower electrode material 2 is etched in a manner described with reference to FIG. 22. When the sputter etching is performed on the lower electrode material 2 of Pt using, e.g., an Ar/$O_2$ gas mixture as an etchant, the helicon wave plasma etching equipment, for example, may be used as in the first preferred embodiment under the following conditions: an Ar:$O_2$ flow rate (in sccm) ratio of 4:1 of the Ar/$O_2$ gas mixture, a pressure of 1.6 mTorr, a stage temperature of 40° C., a source power of 1600 W and a bias power of 300 W, thereby providing an etch selectivity between the TiSi film 1b and the lower electrode material 2 which is 1:69.

When the reactive etching is performed on the lower electrode material 2, a $Cl_2$/$O_2$ gas mixture, for example, may be used as an etchant at a stage temperature of 270° C. or higher. This reactive etching allows only the lower electrode material 2 to be etched without etching the TiSiN film 1a and the TiSi film 1b since $Cl_2$ gas is mixed with $O_2$ gas.

Next, part of the barrier metal layer 3 which is not covered with the TiSiN film 1a is removed as shown in FIG. 23 in a manner described in the first preferred embodiment. Thereafter, the TiSiN film 1a and the TiSi film 1b are removed by reactive ion etching using a $Cl_2$/Ar gas mixture as an etchant, e.g., at near room temperature, as is performed during the patterning.

It can be contemplated to use the TiSi film 1b alone as the hard mask. However, a structure including the TiSi film in direct contact with metal such as Pt encounters a reaction regarded as alloying of the TiSi film and the lower electrode material 2 with each other at a high temperature not less than 200° C. It is therefore desirable to form the TiSiN film 1a serving as a barrier layer between the TiSi film 1b and the lower electrode material 2.

As in the first preferred embodiment, the use of the TiSiN film as the barrier metal layer 3 has a process advantage in that the process proceeds rapidly in the steps of forming and removing the hard mask and the barrier metal layer. In this case, the etch rate and etch conditions of the TiSi film 1b and the TiSiN film serving as the barrier metal layer 3 should be taken into consideration to determine the thicknesses of the TiSiN film 1a and the TiSi film 1b serving as the hard mask and the thickness of the TiSiN film serving as the barrier metal layer 3.

The etching method of the second preferred embodiment produces effects similar to those of the first preferred embodiment. Additionally, when $O_2$-based gas is used for etching, the formation of the TiSi film having a higher etch selectivity to metal such as Pt than the TiSiN film on the upper surface of the TiSiN film provides the etch mask having a higher etch selectivity.

Further, when the barrier metal layer 3 is the TiSiN film, the process proceeds rapidly in the steps of forming and removing the hard mask and the barrier metal layer.

Although the film to be etched is made of metal such as Pt as an example in the second preferred embodiment, the multilayered film comprised of the TiSiN film and the TiSi film functions as the hard mask when other materials are used as the film to be etched. The multilayered film comprised of the TiSiN film and the TiSi film functions as the etch mask not only for dry etching such as the sputter etching and reactive etching but also for wet etching of metal. Therefore, the second preferred embodiment of the present invention may be also applied to general etching methods.

Third Preferred Embodiment

A third preferred embodiment of the present invention is a modification of the first or second preferred embodiment and features an etching method in which isotropic etching is additionally performed on the hard mask patterned by the photolithographic technique to provide a hard mask of a smaller pattern size.

Figure 10:
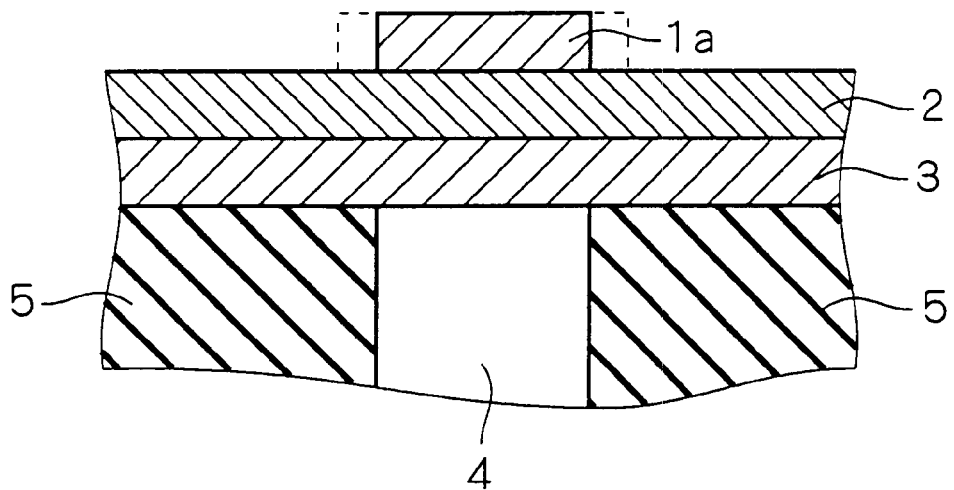
FIGS. 10 and 11 are cross-sectional views showing respective steps in the etching method according to a third preferred embodiment of the present invention.
Figure 11:
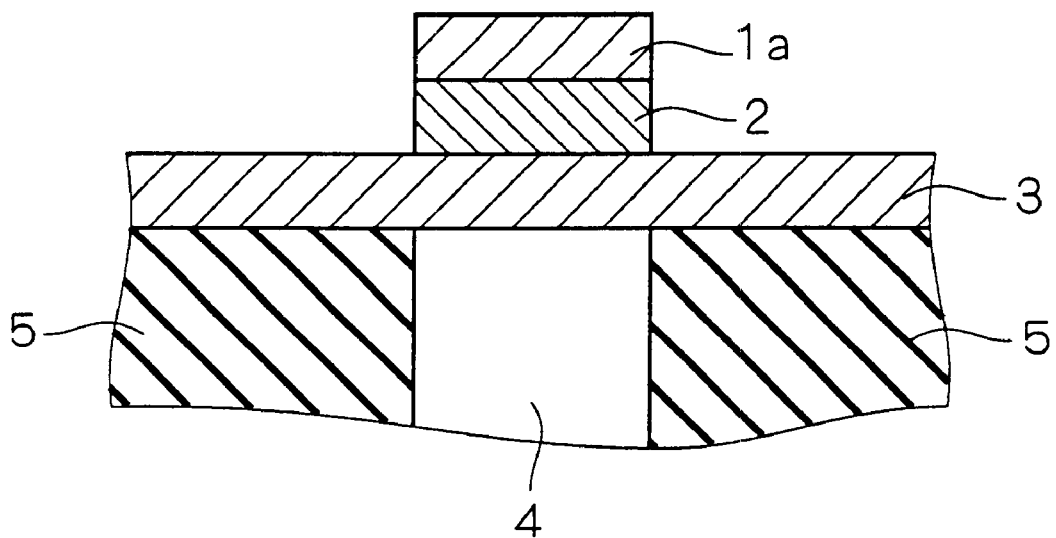

With reference to FIGS. 10 and 11, the third preferred embodiment of the present invention will be described, taking the etching method of the first preferred embodiment as an example.

First, the etching method of the first preferred embodiment is used to provide the structure shown in FIG. 5. Then, wet etching using a mixture of hydrofluoric acid and hydrogen peroxide solution (e.g., a mixture having a $HF:H_2O_2$ volume concentration ratio of 500:1) is performed on the TiSiN film 1a over controlled etch time, thereby reducing the pattern size of the TiSiN film 1a (FIG. 10). Using the narrowed TiSiN film 1a as the hard mask, the above described sputter etching or reactive etching is performed to pattern the lower electrode material 2 (FIG. 11).

Thus, the isotropic etching is additionally performed on the TiSiN film patterned using the photolithographic technique to form a pattern smaller than the minimum pattern size specified by the optical limit of the photolithographic technique.

Although the wet etching using the mixture of hydrofluoric acid and hydrogen peroxide solution is described above as an example of the isotropic etching, other wet etching or dry etching may be used which can isotropically etch only the TiSiN film without etching the lower electrode material 2. The above-mentioned wet etching using the mixture of hydrofluoric acid and hydrogen peroxide solution can isotropically etch only the TiSiN film without etching the lower electrode material 2 when the lower electrode material is metal such as Pt.

The third preferred embodiment is also applicable to the etching method of the second preferred embodiment and may reduce the pattern size of the multilayered film comprised of the TiSiN film 1a and the TiSi film 1b by a similar technique. The use of the wet etching using the mixture of hydrofluoric acid and hydrogen peroxide solution as above described allows the TiSiN film 1a and the TiSi film 1b to be etched at substantially the same etch rate when the pattern size is reduced by on the order of 0.01 to 0.05 μm.

The etching method of the third preferred embodiment can narrow the TiSiN film 1a or the multilayered film comprised of the TiSiN film 1a and the TiSi film 1b serving as the hard mask, thereby to pattern the film to be etched into a smaller configuration.

While the invention has been described in detail, the foregoing description is in all aspects illustrative and not restrictive. It is understood that numerous other modifications and variations can be devised without departing from the scope of the invention.

What is claimed is:

1. A method of etching, comprising the steps of:

(a) preparing a substrate;

(b) forming a film to be etched with a physical vapor deposition apparatus on said substrate;

(c) forming a first TiSiN film with a physical vapor deposition apparatus on a surface of said film to be etched;

(d) patterning said first TiSiN film by a photolithographic technique; and (e) etching said film to be etched, using said patterned first TiSiN film as an etch mask; and (f) forming a second TiSiN film between said substrate and said film to be etched, said step (f) being performed before said step (b).

2. The method according to claim 1, wherein said second TiSiN film is formed using a physical vapor deposition apparatus in step (f).

3. A method of etching, comprising the steps of (a) preparing a substrate;

(b) forming a film to be etched on said substrate;

(c) forming a first TiSiN film on a surface of said film to be etched;

(d) patterning said first TiSiN film by a photolithographic technique;

(e) etching said film to be etched, using said patterned first TiSiN film as an etch mask; and (f) isotropically etching said first TiSiN film, said step (f) being performed after said step (d) and before said step (e).

4. The method according to claim 3, wherein said film to be etched is formed using a physical vapor deposition apparatus in said step (b); and wherein said first TiSiN film is formed using said physical vapor deposition apparatus in said step (c).

5. The method according to claim 3, further comprising the step of (g) forming a second TiSiN film on said substrate, said step (g) being performed before said step (b).

6. The method according to claim 5, wherein said second TiSiN film is formed using a physical vapor deposition apparatus in said step (g);

wherein said film to be etched is formed using said physical vapor deposition apparatus in said step (b); and wherein said first TiSiN film is formed using said physical vapor deposition apparatus in said step (c).

7. A method of etching, comprising the steps of:

(a) preparing a substrate;

(b) forming a film to be etched on said substrate;

(c) forming a first TiSiN film on a surface of said film to be etched;

(d) patterning said first TiSiN film by a photolithographic technique;

(e) etching said film to be etched, using said patterned first TiSiN film as an etch mask; and (f) forming a TiSiN on a surface of said first TiSiN film, said step (f) being performed before said step (d), wherein said first TiSiN film and said TiSi film are patterned into the same configuration by a photolithographic technique is said step (d).

8. The method according to claim 7, wherein said film to be etched is formed using a physical vapor deposition apparatus in said step (b);

wherein said first TiSiN film is formed using said physical vapor deposition apparatus in said step (c); and wherein said TiSi film is formed using said physical vapor deposition apparatus in said step (f).

9. The method according to claim 7, further comprising the step of (g) forming a second TiSiN film on said substrate, said step (g) being performed before said step (b).

10. The method according to claim 9, wherein said second TiSiN film is formed using a physical vapor deposition apparatus in said step (g);

wherein said film to be etched is formed using said physical vapor deposition apparatus in said step (b);

wherein said first TiSiN film is formed using said physical vapor deposition apparatus in said step (c); and wherein said TiSi film is formed using said physical vapor deposition apparatus in said step (f).

11. The method according to claim 7, further comprising the step of (g) isotropically etching said first TiSiN film and said TiSi film, said step (g) being performed after said step (d) and before said step (e).

12. The method according to claim 11, wherein said film to be etched is formed using a physical vapor deposition apparatus in said step (b);

wherein said first TiSiN film is formed using said physical vapor deposition apparatus in said step (c); and wherein said TiSi film is formed using said physical vapor deposition apparatus in said step (f).

13. The method according to claim 11, further comprising the step of (h) forming a second TiSiN film on said substrate, said step (h) being performed before said step (b).

14. The method according to claim 13, wherein said second TiSiN film is formed using a physical vapor deposition apparatus in said step (h);

wherein said film to be etched is formed using said physical vapor deposition apparatus in said step (b);

wherein said first TiSiN film is formed using said physical vapor deposition apparatus in said step (c); and wherein said TiSi film is formed using said physical vapor deposition apparatus in said step (f).

15. An etch mask comprising:

a first layer made of TiSiN; and a second layer made of TiSi and formed on an upper surface of said first layer.

16. A method of etching, comprising the steps of:

(a) preparing a substrate;

(b) forming a film to be etched on said substrate, with an interlayer insulation film therebetween;

(c) forming a first TiSiN film on a surface of said film to be etched;

(d) patterning said first TiSiN film by a photolithographic technique;

(e) dry-etching said film to be etched, using said patterned first TiSiN film as an etch mask, to expose a portion of said interlayer insulation film which is not covered with said first TiSiN film;

(f) forming a second TiSiN film between said interlayer insulation film and said film to be etched, said step (f) being performed before said step (b).

17. The method according to claim 16, wherein said film to be etched is formed using a physical vapor deposition apparatus in said step (b); and wherein said first TiSiN film is formed using said physical vapor deposition apparatus in said step (c).

18. The method according to claim 16, wherein said second TiSiN film is formed using a physical vapor deposition apparatus in said step (f);

wherein said film to be etched is formed using said physical vapor deposition apparatus in said step (b); and wherein said first TiSiN film is formed using said physical vapor deposition apparatus in said step (c).

19. The method according to claim 16, further comprising the step of (g) isotropically etching said first TiSiN film, said step (g) being performed after said step (d) and before said step (e).

20. The method according to claim 19, wherein said film to be etched is formed using a physical vapor deposition apparatus in said step (b); and wherein said first TiSiN film is formed using said physical vapor deposition apparatus in said step (c).

21. The method according to claim 19, further comprising the step of (h) forming a second TiSiN film on said interlayer insulation film, said step (h) being performed before said step (b).

22. The method according to claim 16, further comprising the step of (i) forming a TiSi film on a surface of said first TiSiN film, said step (i) being performed before said step (d), wherein said first TiSiN film and said TiSi film are patterned into the same configuration by a photolithographic technique in said step (d).

23. The method according to claim 16, wherein said film to be etched comprises platinum.

24. The method according to claim 1, wherein said film to be etched comprises platinum.

* * * * *